(12) United States Patent
Pfautz

(10) Patent No.: US 7,152,271 B2
(45) Date of Patent: Dec. 26, 2006

(54) APPARATUS FOR ADJUSTING A VACUUM SELECTOR

(75) Inventor: Douglas Sebastian Pfautz, Landisville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 620 days.

(21) Appl. No.: 10/391,132

(22) Filed: Mar. 18, 2003

(65) Prior Publication Data

US 2004/0181895 A1     Sep. 23, 2004

(51) Int. Cl.
*A47L 5/38* (2006.01)
(52) U.S. Cl. .................................. 15/309.2; 15/301
(58) Field of Classification Search ............. 15/309.2, 15/328, 331, 419, 301; 251/319; 137/625.48, 137/872; 406/181
See application file for complete search history.

(56) References Cited

U.S. PATENT DOCUMENTS

| | | | | |
|---|---|---|---|---|
| 2,252,141 A * | 8/1941 | Seidel et al. | ........... | 137/625.48 |
| 3,678,959 A * | 7/1972 | Liposky | ................. | 137/625.11 |
| 3,771,561 A * | 11/1973 | Santamaria, Jr. | ............ | 137/872 |
| 3,880,047 A | 4/1975 | Dosier | ......................... | 409/134 |
| 4,019,535 A * | 4/1977 | Buckethal | .............. | 137/625.15 |
| 4,561,471 A * | 12/1985 | Diaz | ..................... | 137/625.18 |
| 4,621,552 A | 11/1986 | Lopez | ........................... | 83/27 |
| 4,683,789 A | 8/1987 | Lopez | ............................ | 83/35 |
| 4,742,615 A | 5/1988 | Lopez | .......................... | 29/846 |
| 4,821,365 A | 4/1989 | Charters | ....................... | 15/339 |
| 4,830,554 A | 5/1989 | Lopez | ......................... | 409/164 |
| 4,884,594 A * | 12/1989 | Powers et al. | ......... | 137/625.48 |
| 5,083,704 A * | 1/1992 | Rounthwaite | ............... | 232/43.2 |
| 5,084,952 A | 2/1992 | Grabow | ....................... | 29/338 |
| 5,117,554 A | 6/1992 | Grabow | ....................... | 29/791 |
| 5,210,922 A | 5/1993 | Carr | ........................... | 29/426.3 |
| 5,438,740 A | 8/1995 | Carr et al. | ................... | 29/33 P |
| 5,894,648 A | 4/1999 | Hill et al. | .................... | 29/33 P |
| 5,993,124 A | 11/1999 | Cooper et al. | .............. | 409/137 |
| 6,039,817 A * | 3/2000 | Payne | .......................... | 15/331 |
| 6,169,418 B1 | 1/2001 | Wagner | ........................ | 326/41 |
| 6,192,563 B1 | 2/2001 | Carr et al. | ................... | 29/33 P |
| 6,250,859 B1 | 6/2001 | Bosten et al. | ................ | 409/131 |
| 6,357,108 B1 | 3/2002 | Carr | ............................. | 29/711 |
| 6,519,749 B1 | 2/2003 | Chao et al. | .................... | 716/9 |
| 2001/0038612 A1 | 11/2001 | Vaughn et al. | .............. | 370/256 |

* cited by examiner

*Primary Examiner*—Theresa T. Snider

(57) ABSTRACT

A vacuum selector is provided. The vacuum selector includes a housing having first and second faces, the first face including first and second openings, the second face including a primary opening that communicates with the first and second openings along a flow path through the housing. The vacuum selector further includes a slider member movably provided in the housing and traversing the flow path, the slider member including a selector opening therethrough, the slider member being movable transversely to the flow path such that the selector opening changes the flow path to adjust flow communication between the primary opening and the first and second openings.

20 Claims, 6 Drawing Sheets

# APPARATUS FOR ADJUSTING A VACUUM SELECTOR

BACKGROUND OF THE INVENTION

The invention relates generally to removing PC boards from a panel, and more particularly, relates to providing a selectively adjustable vacuum for removing debris from the PC boards as the PC boards are cut from the panel.

A known method in the mass production of PC boards is to assemble multiple PC boards at one time integrally in a single panel. By using a single panel, assembly equipment need only manipulate a single structure to operate on multiple PC boards. This simplifies the production of the PC boards and reduces the amount of equipment needed to produce the PC boards. Furthermore, the time needed to produce each PC board is reduced. Mass production of the PC boards in a single panel requires that each individual PC board must be removed or depaneled from the panel before the individual PC boards may be integrated into electronic equipment.

In order to depanel PC boards from a panel, all connections between each individual PC board and the panel must be severed. Automated depaneling systems are commonly used to sever all connections between the individual PC boards and the panel. The individual PC boards are then moved by the automated depaneling system to a subsequent processing system or to a registration element which provides the individual PC boards to the subsequent processing system.

Debris collects on the PC boards during the depaneling process. One method for removing debris from the PC boards is to use a vacuum when the severing connections between the PC board and the panel. As the connections between the individual PC boards and the panel are severed by the depaneling system, a vacuum is provided above or below the PC boards removing debris remaining on the PC boards. However, the vacuum is not always successful in removing all of the excess debris from the PC board. Vacuuming above the PC board does not remove debris below the PC board and vacuuming below the PC board does not remove debris above the PC board.

BRIEF DESCRIPTION OF THE INVENTION

In one embodiment, a vacuum selector is provided. The vacuum selector includes a housing having first and second faces, the first face including first and second openings, the second face including a primary opening that communicates with the first and second openings along a flow path through the housing. The vacuum selector further includes a slider member movably provided in the housing and traversing the flow path, the slider member including a selector opening therethrough, the slider member being movable transversely to the flow path such that the selector opening changes the flow path to adjust flow communication between the primary opening and the first and second openings.

In another embodiment, a debris removal system for removing debris from a working surface is provided. The debris removal system includes a vacuum source and a vacuum selector. The vacuum selector includes a housing having first and second faces, the first face including first and second openings, the second face including a primary opening that communicates with the first and second openings along a flow path through the housing. The vacuum selector further includes a slider member movably provided in the housing and traversing the flow path, the slider member including a selector opening therethrough, the slider member being movable transversely to the flow path such that the selector opening changes the flow path to adjust flow communication between the primary opening and the first and second openings. The dust removal system further includes an upper conduit having one end coupled to the first opening and another end adapted for removing debris from above the working surface and a lower conduit having one end coupled to the second opening and another end adapted for removing debris from below the working surface.

In another embodiment, a method for infinitely adjusting flow communication between a vacuum source and a vacuum selector is provided. The vacuum selector includes a housing having first and second faces, the first face including first and second openings, the second face including a primary opening that communicates with the first and second openings along a flow path through the housing. The vacuum selector further includes a slider member movably provided in the housing and traversing the flow path, the slider member including a selector opening therethrough, the slider member being movable transversely to the flow path such that the selector opening changes the flow path to adjust flow communication between the primary opening and the first and second openings. The method includes energizing a vacuum source to cause flow communication between the primary opening, the selector opening, and at least one of the first and second openings and adjusting the slider member between the first half and the second half to vary flow communication between the primary opening, the selector opening and at least one of the first and second openings.

DETAILED DESCRIPTION OF THE INVENTION

Figure 1:
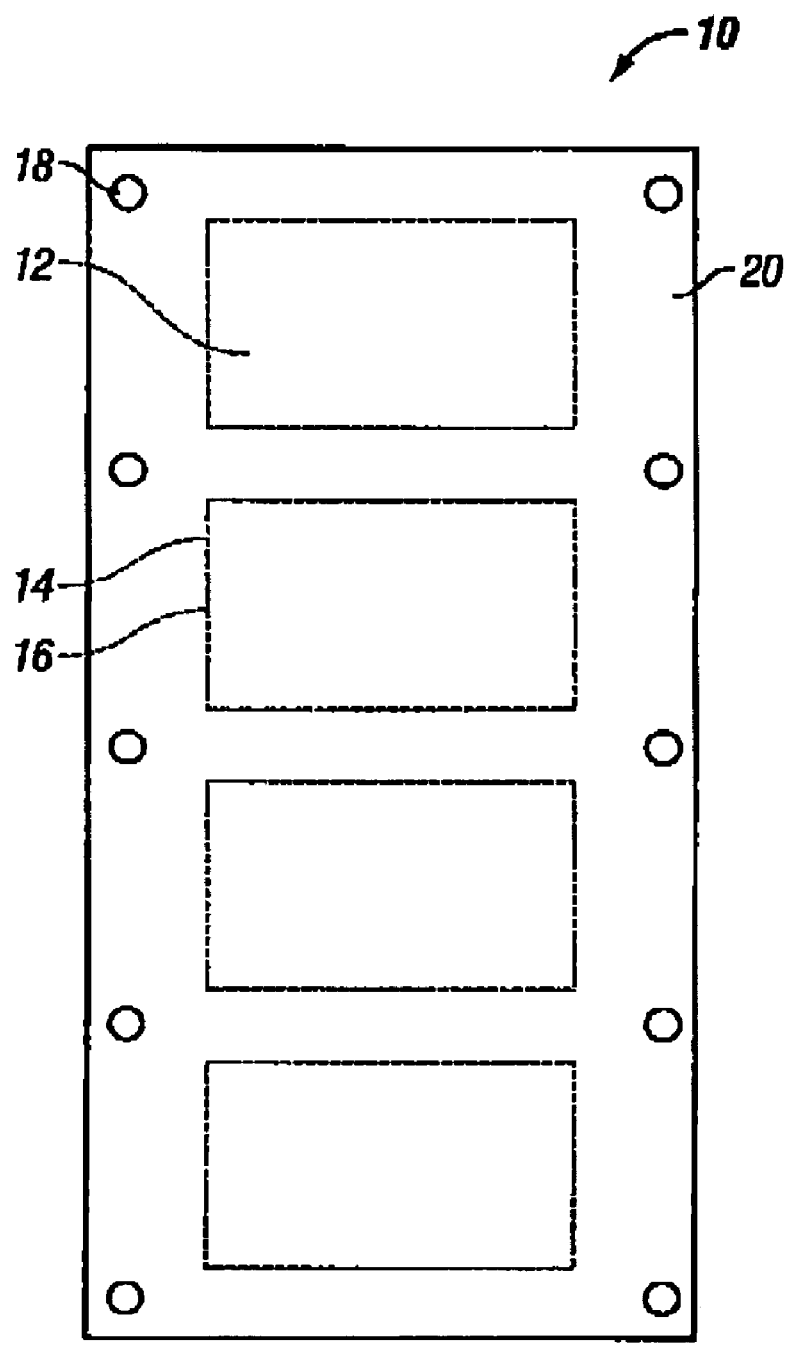
FIG. 1 illustrates a panel of PC boards.

FIG. 1 illustrates panel 10 including a plurality of PC boards 12 formed therein. Slots 14 and tabs 16 define the edges of PC boards 12. The tabs 16 connect PC boards 12 to panel 10 and are cut during the depaneling process to liberate PC boards 12 from panel 10. Registration holes 18 in each panel 10 may be used to determine the position and orientation of panel 10 in a depaneling system. Frame 20 is the material of panel 10 that holds PC boards 12 together as one panel 10. After tabs 16 are cut debris from tabs 16 collects on the PC boards 12. Although panel 10 is shown with four PC boards 12, it is understood that panel 10 may have any number of PC boards 12 and may be arranged on panel 10 in any configuration. Furthermore, panel 10 and PC boards 12 may have any shape and are not constrained to the rectangular shapes shown.

Figure 2:
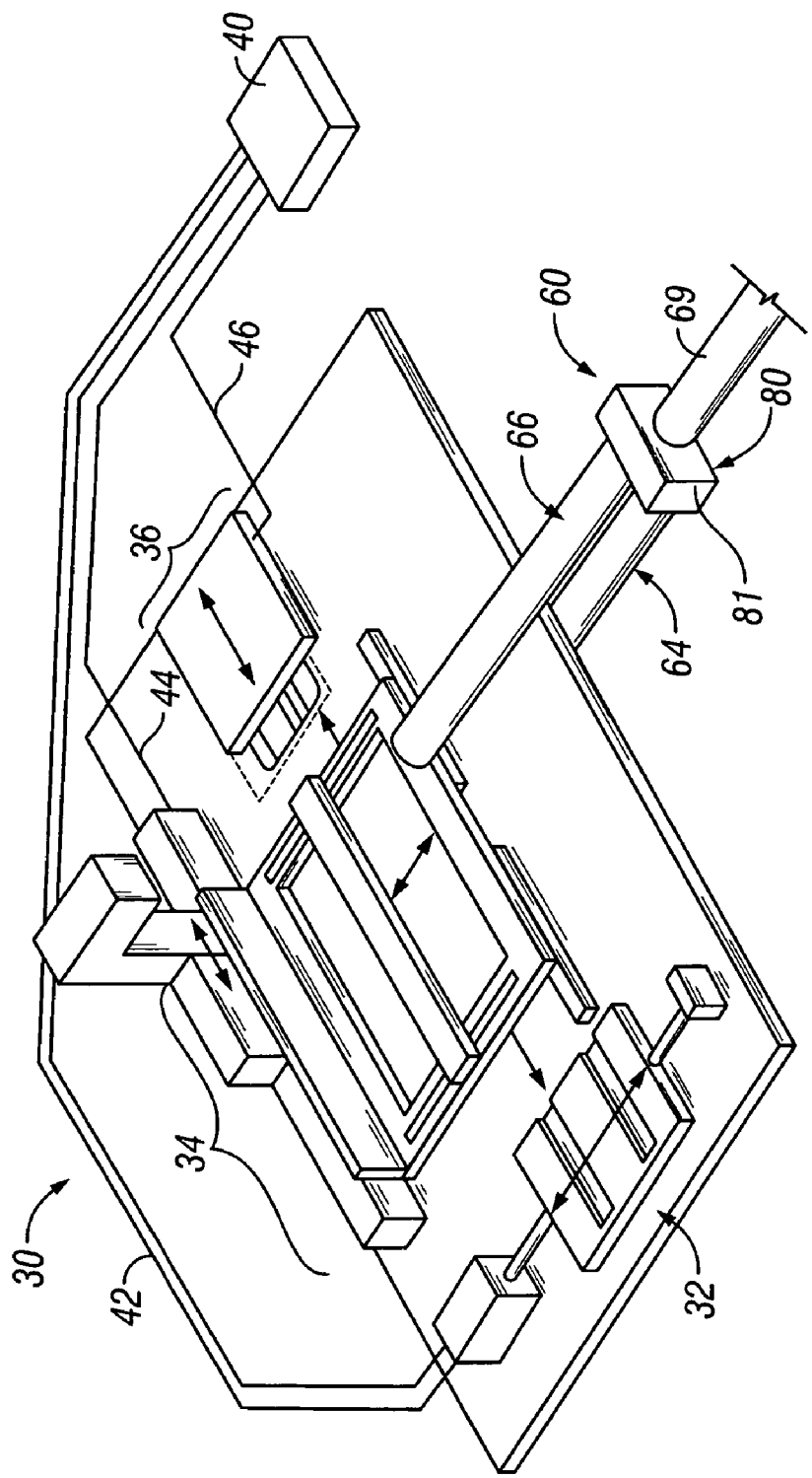
FIG. 2 illustrates an exemplary embodiment of a depaneling system with a router station that uses a vacuum selector in accordance with an embodiment of the invention.

FIG. 2 is an exemplary embodiment of depaneling system 30. Depaneling system 30 has a feeder station 32, a router station 34, and a registration station 36 for removing PC boards 12 from panel 10. Those skilled in the art will appreciate that embodiments of the present invention may also be used in a tab reduction system in which not all of tabs 16 in panel 10 are severed. In a tab reduction system, the PC boards 12 are removed in a subsequent processing system. Furthermore, the present invention could be used in any other system, other than a depaneling system.

In general, depaneling system 30 operates in the following manner. Panel 10 is received by feeder station 32 and delivered to router station 34. Router station 34 severs all of the connections between panel 10 and PC boards 12. After all of the connections have been severed by router station 34, registration station 36 receives PC boards 12 from router station 34. Registration station 36 delivers PC boards 12 to a subsequent processing system (not shown).

The processes performed by the stations of depaneling system 30 are controlled by a controller 40. Controller 40 may be a personal computer or any other type of processor capable of executing a series of instructions that are stored in a memory of controller 40. Signals are transmitted between feeder station 32 and controller 40 via path 42, between router station 34 and controller 40 via path 44, and between registration station 36 and controller 40 via path 46. Although only one router station 34 is shown for exemplary purposes, it should be apparent to those skilled in the art that any number of router stations 34 can be added to operate in parallel. Optionally, a stand alone system with operator intervention may be utilized rather than an automated depaneling system 30.

Figure 3:
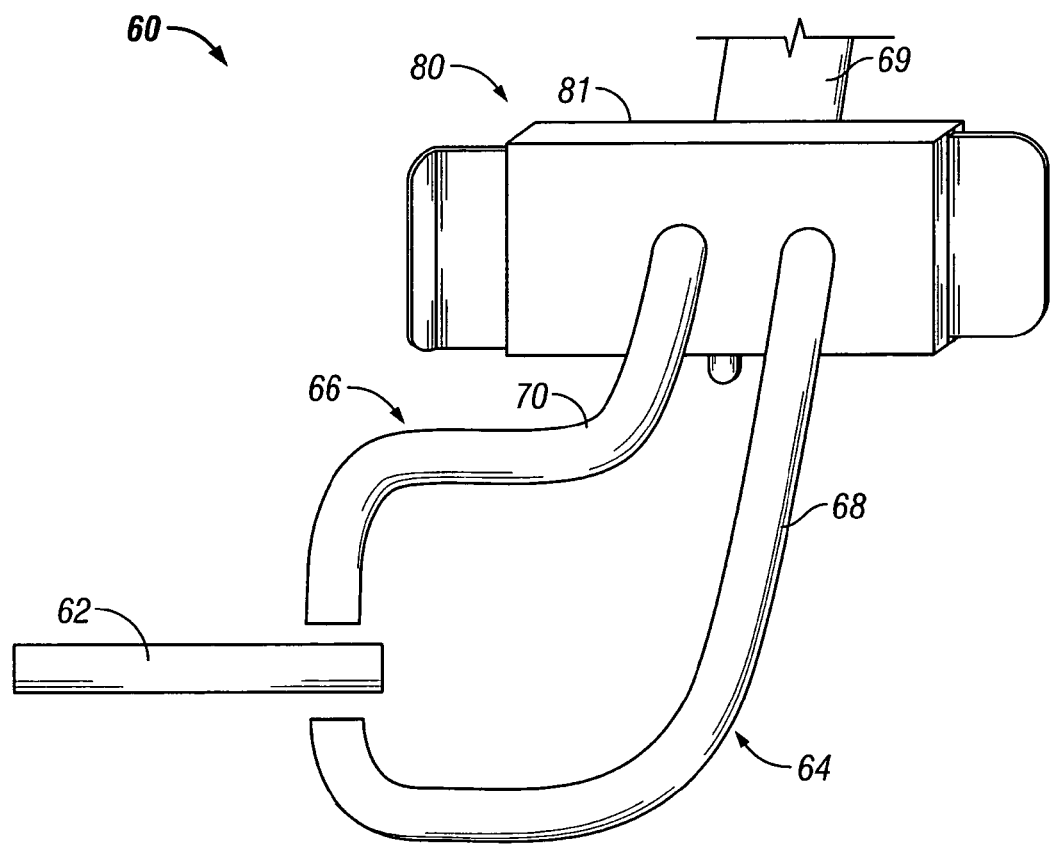
FIG. 3 illustrates a debris removal system for the depaneling system of FIG. 2 that uses a vacuum selector in accordance with an embodiment of the invention.

FIG. 3 is an exemplary embodiment of a debris collection system 60 coupled to the depaneling system 30. Generally, the debris collection system 60 includes a router working surface or router sub-base 62 adapted for connection to router station 34. Alternatively, the router sub-base 62 may be integrated into router station 34. Debris is removed from the surface of board 12 when being depaneled to prevent the debris from settling on other components. Debris collection system 60 includes a lower vacuum flowpath 64 and an upper vacuum flowpath 66. The lower vacuum flowpath 64 is arranged and configured to evacuate dust and other debris from beneath router sub-base 62. The upper vacuum flowpath 66 is arranged and configured to evacuate dust and other debris from above router sub-base 62. Lower vacuum flowpath 64 of the debris collection system 60 is formed by a lower conduit 68 adapted for connection to a vacuum source 69. Upper vacuum flowpath 66 of the debris collection system 60 is formed by an upper conduit 70 adapted for connection to the vacuum source 69. The vacuum source 69 is energized by controller 40 or other power source to cause airflow from router sub-base 62 through lower and upper vacuum flowpaths 64 and 66 to the vacuum source 69. Debris collection system 60 further includes a vacuum selector 80 including a housing 81 coupled to the vacuum source 69 on one side and coupled to the lower and upper vacuum flowpaths 64 and 66 on the other side, as will be discussed in more detail below.

Figure 4:
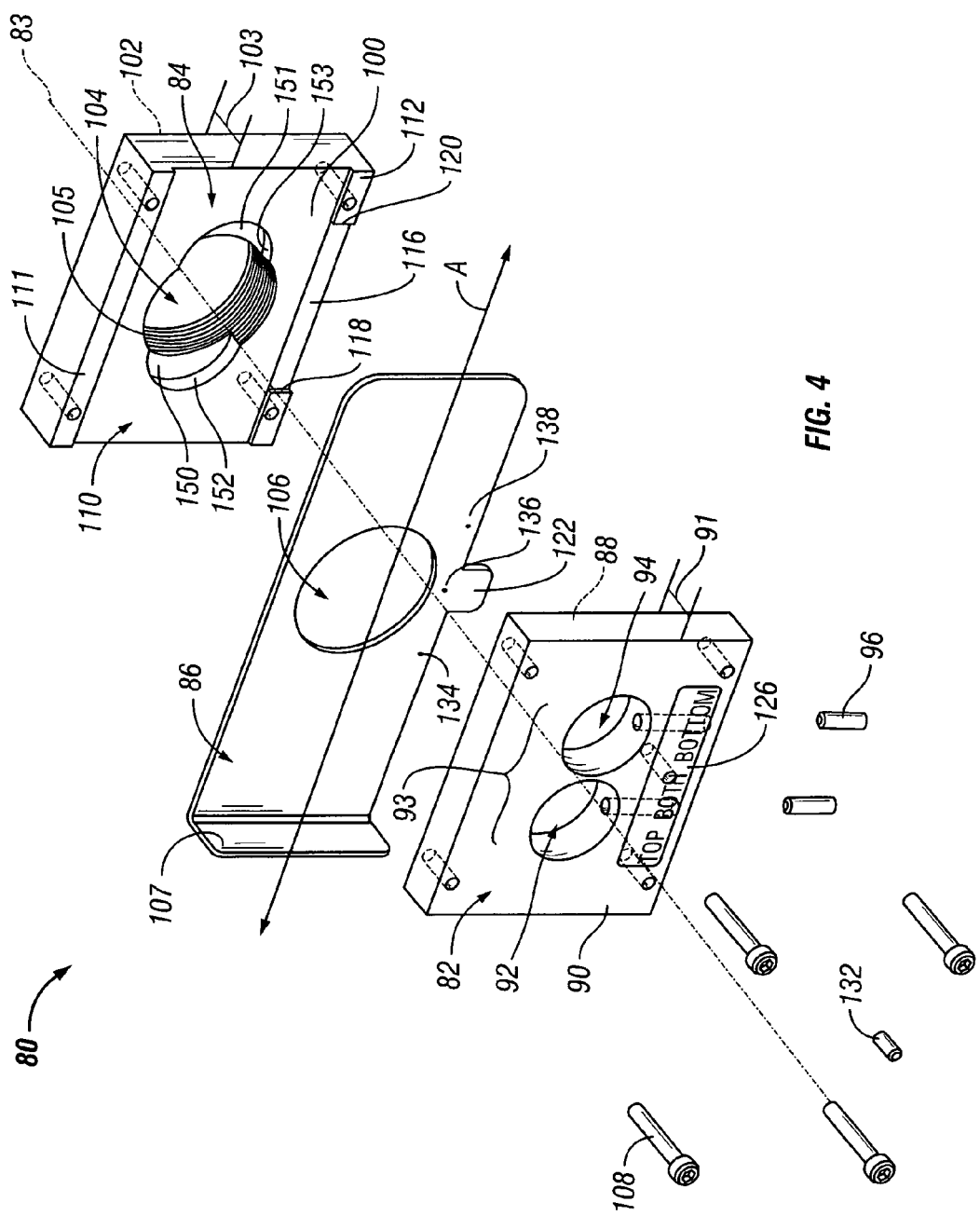
FIG. 4 is an exploded view of an exemplary vacuum selector formed in accordance with an embodiment of the invention.
Figure 5:
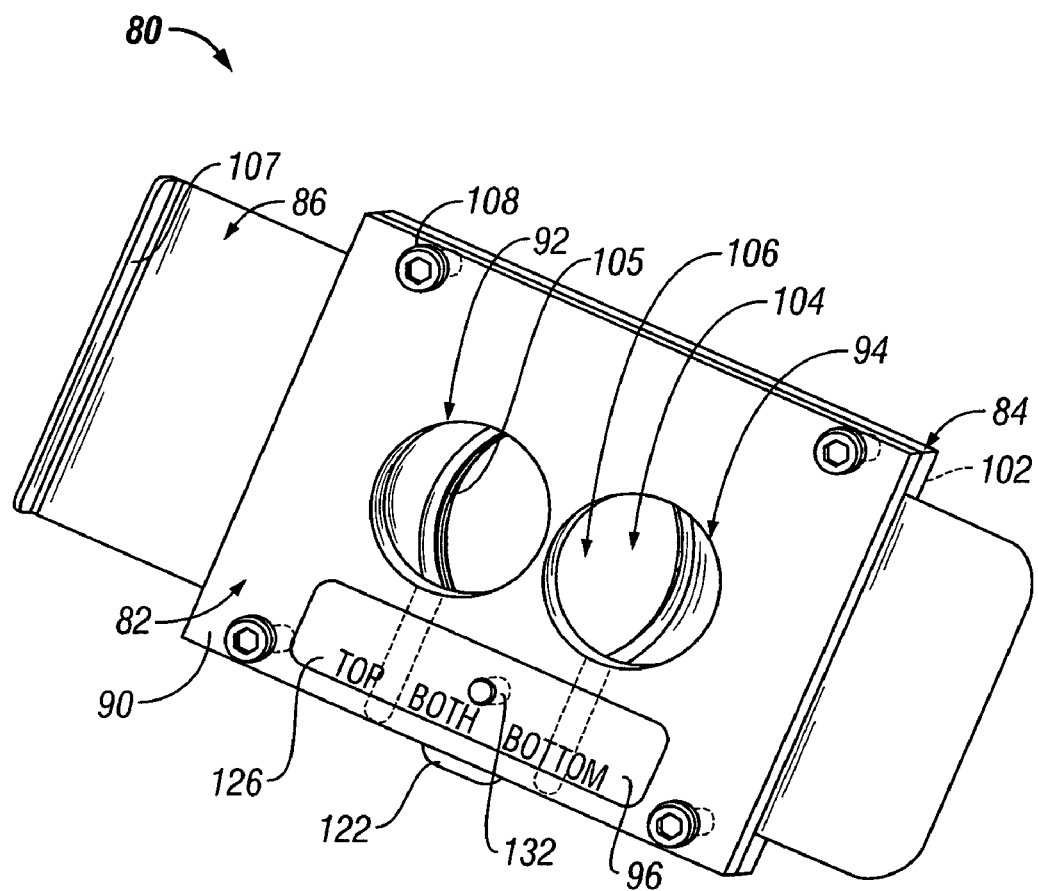
FIG. 5 is a perspective view of the exemplary vacuum selector of FIG. 4.

FIG. 4 is an exploded view of a vacuum selector 80. FIG. 5 is perspective view of vacuum selector 80. The housing 81 of the vacuum selector 80 includes first and second housing plates 82 and 84, respectively. A slider member 86 is disposed between, and is movable relative to, the first and second housing plates 82 and 84. In the exemplary embodiment, first housing plate 82 may be substantially rectangular in shape with an inner surface 88 and an outer surface 90 (forming a first face) spaced apart by a thickness 91. The first housing plate 82 includes at least a first opening 92 and a second opening 94 therethrough provided side-by-side along opposite sides of a central axis 83. First opening 92 is configured for coupling to upper conduit 70, and second opening 94 is configured for coupling to lower conduit 68. In one embodiment, first housing plate 82 includes fasteners 96, such as screws, which extend through first housing plate 82 into the first opening 92 and the second opening 94 to engage and retain the lower conduit 68 and upper conduit 70.

The second housing plate 84 may also be substantially rectangular in shape with an inner surface 100 and an outer surface 102 (forming a second face) spaced apart by a thickness 103. Second housing plate 84 includes a primary opening 104 therethrough centered along central axis 83. In one embodiment, primary opening 104 has threads 105 for accommodating a conduit (not shown) to the vacuum source 69.

Slider member 86 may be formed as an elongate plate with a selector opening 106 therethrough. Slider member 86 has at one end a handle portion 107 which may be formed substantially perpendicular to a length of the slider member 86. Slider member 86 is slidably disposed between first housing plate 82 and second housing plate 84 when first housing plate 82 is coupled to second housing plate 84. The first housing plate 82 may be coupled to second housing plate 84 with fasteners 108. Optionally, slider member 86 is movably provided between first housing plate 82 and second housing plate 84, such as, but not limited to, a ball valve, a blast gate valve or individual airflow barriers for each of the first and second openings 92 and 94, whereby the airflow barriers are selectively operable between an open and a closed position.

In one embodiment, the second housing plate 84 includes a channel 110 extending along inner surface 100 in a direction transverse to the central axis 83. A pair of parallel ridges 111 and 112 define upper and lower edges of the channel 110. Ridge 112 has a recess 116 extending laterally between a first stop 118 and a second stop 120 provided proximate opposite ends of the ridge 112. When first housing plate 82 is coupled to second housing plate 84, slider member 86 is slidably held within channel 110. The slider member 86 has a tab 122 extending downward to slide along recess 116 between first and second stops 118 and 120. The slider member 86 is prevented from sliding laterally entirely out of first housing plate 82 and second housing plate 84 when tab 122 contacts either first stop 118 or second stop 120.

The first and second housing plates 82 and 84 define an airflow path along the central axis 83. The slider member 83 is movable selectively and continuously in a direction transverse to the air flow path (as shown by arrow A). The slider member 86 is selectively operable between first and second stops 118 and 120. As slider member 86 is slidably moved between first and second stops 118 and 120, selector opening 106 varies the amount of flow communication between at least one of first and second openings 92 and 94 and primary opening 104, thereby varying the air flow of the lower and upper flowpaths 64 and 66. Thus, lower and upper flowpaths 64 and 66 are continuously and infinitely adjustable through vacuum selector 80 as slider member 86 slides in the transverse direction A between first housing plate 82 and second housing plate 84. Slider member 86 is selectively slidable by handle portion 107 or by tab 122. Optionally, the vacuum selector 80 may include indicia 126 on outer surface 90 of first housing plate 82 for indicating flow communication through (1) only lower flowpath 64, (2) only upper flowpath 66, or (3) both lower and upper flowpaths 64 and 66. Indicia 126 is labeled according to the position of tab 122 between first and second stops 118 and 120.

In another embodiment, slider member 86 includes detents 134, 136 and 138 on one side of slider member 86. Optionally, slider member 86 includes holes instead of detents through slider member 86. Inner surface 88 of first housing plate 82 has a spring loaded member 132 extending therefrom. The spring loaded member 132 separately engages each of the detents 134, 136 and 138 to adjust slider member 86 between a plurality of positions relative first housing plate 82 and second housing plate 84. Spring loaded member 132 encapsulates a spring in a body and provides a plunger tip or ball end enabling accurate and repeatable end forces. The spring loaded member 132 also pushes slide member 86 against surface 110 creating friction which keeps slider member 86 from moving when not in a detent position.

The detent 134 corresponds to a first position, the detent 136 corresponds to a second position and the detent 138 corresponds to a third position. In the first position, spring loaded member 132 engages detent 134, whereby only second opening 94 is in flow communication with primary opening 104 through selector opening 106. In the second position, spring loaded member 132 engages detent 136, whereby both first and second openings 92 and 94 are in (at least partial) flow communication with primary opening 104 through selector opening 106, as shown in FIG. 5. In the third position, spring loaded member 132 engages detent 138, thereby only first opening 92 is in flow communication with primary opening 104 through selector opening 106.

In one embodiment, inner surface 100 of second housing plate 84 has recesses 150 and 151 provided adjacent to the primary opening 104. The recesses 150 and 151 are formed with arcuate outer perimeters 152 and 153, as shown in FIG. 4, extending along the transverse direction A. When slider member 86 is in the first and third positions, arcuate outer perimeters 152 and 153 of recesses 150 and 151 are substantially aligned with outer perimeters of first and second openings 92 and 94, respectively.

Figure 6:
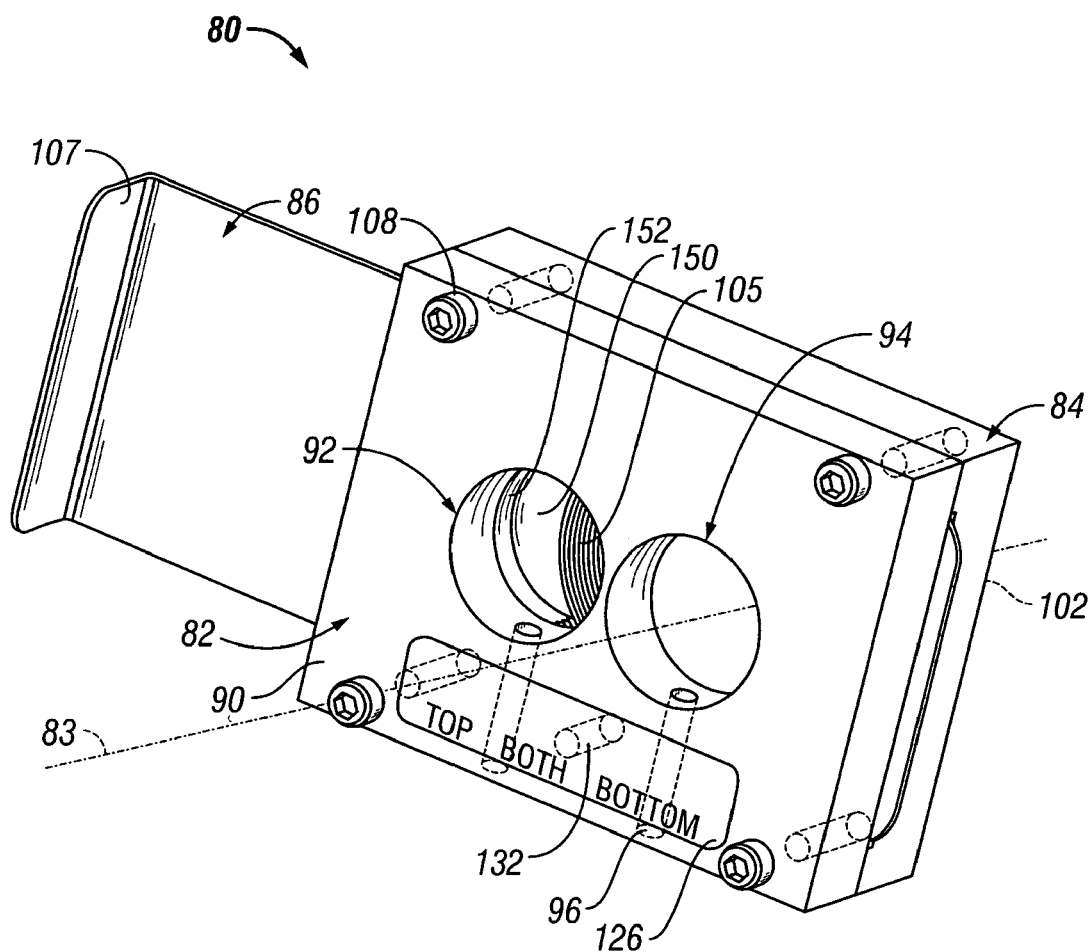
FIG. 6 is a perspective view of the exemplary vacuum selector of FIG. 4.

FIG. 6 is a perspective view of vacuum selector 80. Slider member 86 is in the first position. Thus, primary opening 104 is in flow communication with selector opening 106 and with first opening 92. As shown in FIG. 6, arcuate outer perimeter 152 of recess 150 is substantially aligned or in communication with first opening 92. Second opening 94 is not in flow communication with selector opening 106 and primary opening 104.

The selector opening 106 may have a diameter approximately equal to a diameter of the primary opening 104. In the exemplary embodiment, the first and second openings 92 and 94 have a common diameter and are provided adjacent one another to define an outer envelope 93 that is greater than the diameter of the primary opening 104. Optionally, the diameter of the primary and selector openings 104 and 106 may differ. Optionally, the diameters of the first and second openings 92 and 94 may differ. Optionally, the outer envelope 93 may equal or be smaller than the selector opening 106 and/or primary opening 104.

Optionally, an electric motor, air cylinder or other prime mover may be attached to selector member 86 and the controller 40 (FIG. 1) may be used to automatically adjust the selector member 86.

While the invention has been described in terms of various specific embodiments, those skilled in the art will recognize that the invention can be practiced with modification within the spirit and scope of the claims.

What is claimed is:

1. A vacuum selector comprising:
   a housing having first and second faces, said first face including first and second openings, said second face including a primary opening that communicates with said first and second openings along a flow path through said housing; and
   a slider member movably provided in said housing and traversing said flow path, said slider member including a selector opening therethrough, said slider member being movable transversely to said flow path such that said selector opening changes said flow path to adjust flow communication between said primary opening and said first and second openings, wherein said housing includes a spring loaded member that extends into a channel formed in said housing, said channel receiving said slider member, said slider member having a detent that engage said spring loaded member when said slider member is adjusted between a plurality of positions.

2. The vacuum selector according to claim 1, wherein said housing includes first and second housing plates joining to slidably retain said slider member therebetween, the first and second housing plates having the first and second faces, respectively.

3. The vacuum selector according to claim 1, wherein said housing includes first and second housing plates, said first and second openings extending through said first housing plate, said primary opening extending through said second housing plate, the first and second housing plates having the first and second faces, respectively.

4. The vacuum selector according to claim 1, wherein said housing includes a channel traversing said flowpath, said slider member being slidable within said channel.

5. The vacuum selector according to claim 1, wherein said slide member is adjusted between a plurality of positions include a first position wherein only said second opening is in flow communication with said selector opening and said primary opening, a second position wherein both of said first and second openings are in flow communication with said selector opening and said primary opening, and a third position wherein only said first opening is in flow communication with said selector opening and said primary opening.

6. The vacuum selector according to claim 1, wherein said housing includes at least one recess adjacent said primary opening with an arcuate perimeter that aligns with an outer perimeter of said first opening, such that, when said slider member is aligned only with said first opening positions, said arcuate perimeter of said recess communicates with said outer perimeter of said first opening.

7. A vacuum selector comprising: a housing having first and second faces, said first face including first and second openings, said second face including a primary opening that communicates with said first and second openings along a flow path through said housing; and a slider member movably provided in said housing and traversing said flow path, said slider member including a selector opening therethrough, said slider member being movable transversely to said flow path such that said selector opening changes said flow path to adjust flow communication between said primary opening and said first and second openings, wherein said housing includes a channel that joins a recess extending substantially along a portion of said channel, said slider member has a tab that is received within said recess and slidable in said recess as said slider member is moved.

8. The vacuum selector according to claim 7, wherein said recess has a first stop at one end of said recess and a second stop at another end of said recess, such that said tab is slidable between said first and second stops.

9. A system for depaneling circuit boards from a panel, comprising:
   a router station receiving a panel having a circuit board connected thereto, the router station severing the circuit board from the panel, the router station producing debris during a depaneling operation; and
   a debris removal system for removing debris from the router station, comprising:
   a vacuum source;
   a vacuum selector comprising: a housing having first and second faces, said first face including first and second openings, said second face including a primary opening that communicates with said first and second openings along a flow path through said housing; and a slider member movably provided in said housing and traversing said flow path, said slider member including a selector opening therethrough, said slider member being movable transversely to said flow path such that said selector opening changes said flow path to adjust flow communication between said primary opening and said first and second openings;
   an upper conduit having one end coupled to said first opening and another end adapted for removing debris from above the router station; and
   a lower conduit having one end coupled to said second opening and another end adapted for removing debris from below the router station.

10. The system according to claim 9, wherein said housing includes first and second housing plates joining to slidably retain said slider member therebetween, the first and second housing plates having the first and second faces, respectively.

11. The system according to claim 9, wherein said housing includes first and second housing plates, said first and second openings extending through said first housing plate, said primary opening extending through said second housing plate, the first and second housing plates having the first and second faces, respectively.

12. The system according to claim 9 wherein said housing includes a channel traversing said flowpath, said slider member being slidable within said channel.

13. The system according to claim 9, wherein said housing includes a channel that joins a recess extending substantially along a portion of said channel, said slider member has a tab that is received within said recess and slidable in said recess as said slider member is moved.

14. The system according to claim 13, wherein said recess has a first stop at one end of said recess and a second stop at another end of said recess, such that said tab is slidable between said first and second stops.

15. The system according to claim 9, wherein said housing includes a spring loaded member that extends into a channel formed in said housing, said channel receiving said slider member said slider member having detent that engage said spring loaded member when said slide member is adjusted between a plurality of positions.

16. The system according to claim 9, wherein said slide member is adjusted between a plurality of positions include a first position wherein only said second opening is in flow communication with said selector opening and said primary opening, a second position wherein both of said first and second openings are in flow communication with said selector opening and said primary opening, and a third position wherein only said first opening is in flow communication with said selector opening and said primary opening.

17. The system according to claim 9, wherein said housing includes at least one recess adjacent said primary opening with an arcuate perimeter that aligns with an outer perimeter of said first opening, such that, when said slider member is aligned only with said first opening, said arcuate perimeter of said recess communicates with said outer perimeter of said first opening.

18. The system of claim 9, further comprising a feeder station that receives the panels and delivers the panels to the router station.

19. The system of claim 9, wherein the debris collection system includes a router sub-base adapted for connection to the router station, the upper and lower conduits being arranged to remove debris from above and below the router sub-base, respectively.

20. The system of claim 9, wherein the slider member is switched between first and second positions to select between the upper and lower conduits.

* * * * *